(12) United States Patent
Hein

(10) Patent No.: US 8,191,498 B2
(45) Date of Patent: Jun. 5, 2012

(54) FILING ASSEMBLY

(75) Inventor: Hubertus Hein, Munich (DE)

(73) Assignee: ITC Intercircuit Electronic GmbH, Munich (DE)

(*) Notice: Subject to any disclaimer, the term of this patent is extended or adjusted under 35 U.S.C. 154(b) by 826 days.

(21) Appl. No.: 12/266,694

(22) Filed: Nov. 7, 2008

(65) Prior Publication Data

US 2009/0123594 A1 May 14, 2009

(30) Foreign Application Priority Data

Nov. 9, 2007 (DE) .......................... 10 2007 053 513

(51) Int. Cl.
*B05C 5/02* (2006.01)
(52) U.S. Cl. .............. 118/57; 118/50; 118/410; 141/69; 141/129; 141/DIG. 1; 425/432; 425/447; 425/456
(58) Field of Classification Search .................. 118/410, 118/411, 412, 313, 315, 57, 50; 425/405.1, 425/456, 110, 546, 432, 447, 449; 228/262, 228/256, 33; 239/4, 102.1, 142, 144; 141/69, 141/71, 129, DIG. 1, 156–161, 163
See application file for complete search history.

(56) References Cited

U.S. PATENT DOCUMENTS

| | | | |
|---|---|---|---|
| 5,254,362 A | 10/1993 | Shaffer et al. | |
| 5,565,033 A * | 10/1996 | Gaynes et al. | 118/210 |
| 6,454,154 B1 * | 9/2002 | Pedigo | 228/33 |
| 6,708,873 B2 * | 3/2004 | Gruber et al. | 228/256 |
| 6,783,797 B2 | 8/2004 | Bourrieres et al. | |
| 2007/0057027 A1 | 3/2007 | Bourrieres et al. | |

FOREIGN PATENT DOCUMENTS

| | | |
|---|---|---|
| JP | 7-68730 A | 3/1995 |
| WO | 0193647 A2 | 12/2001 |

OTHER PUBLICATIONS

Germany Patent and Trademark Office, Office Action for German patent application No. 10 2007 053 513.0-34 issued Jul. 29, 2008.
Taiwan Intellectual Property Office, Office Action for Taiwan patent application No. 097142991 issued Nov. 10, 2009.

* cited by examiner

Primary Examiner — Laura Edwards
(74) Attorney, Agent, or Firm — Cahn & Samuels, LLP

(57) ABSTRACT

Filling assembly for filling holes formed in a plate, such as a printed circuit board, with a filing material, comprising a support device for supporting the plate, a filling device having a filling material source and a feeding channel connected to the filling material source for feeding filling material from the filling material source to the plate supported by the support device, wherein the feeding channel leads to an output opening held adjoining the plate for filling the filling material into the respective hole of the supported plate, and a vibration device connected to a side wall of the feeding channel, by which the side wall can be vibrated at a particular frequency transverse to the feeding channel, such that the feeding channel is correspondingly diminished at least adjacent to its output opening periodically.

20 Claims, 1 Drawing Sheet

FILING ASSEMBLY

Figure 1:
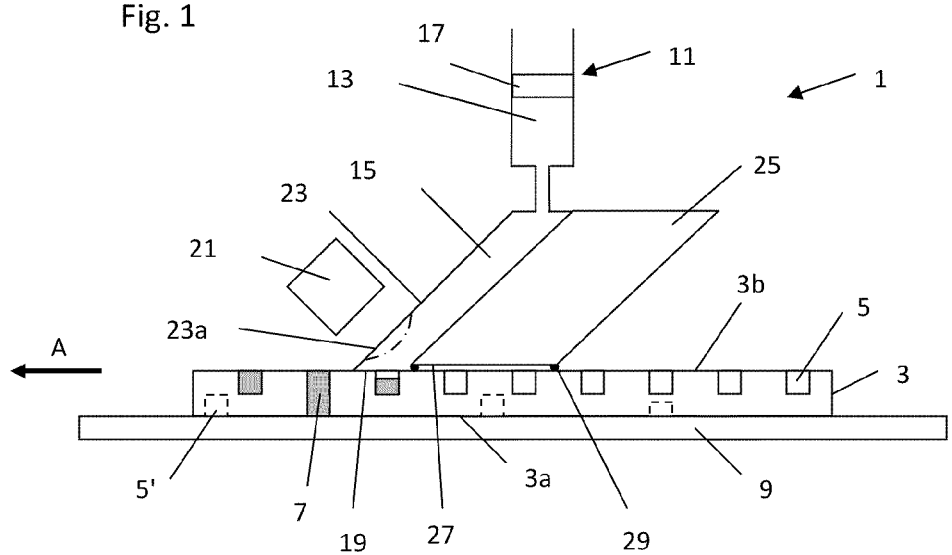

This application claims priority to German Patent Application No. 10 2007 053 513.0-34 filed on Nov. 9, 2007 under the Paris Convention, which application is incorporated by reference.

I. FIELD OF THE INVENTION

The invention relates to a filling assembly for filling holes formed in a plate, such as in a printed circuit board with a filling material, and to the use of the same for filling blind holes formed in a plate.

II. BACKGROUND OF THE INVENTION

In the production of multilayered printed circuit boards holes are formed in said boards to generate contact between the single layers, which holes are then filled with a conductive material or which, for the purpose of saving such a material, are coated for example only on their peripheral walls with metal, and are then closed with a more cost-effective material, such as epoxy resin.

The holes are closed in order to minimize the total surface of the printed circuit board. In addition, for example soldering base pads can be provided on a refilled hole for component parts, such as transistors, ICs, etc. which are to be connected to the printed circuit board. Moreover, a hole in an intermediate layer of the printed circuit board can be used to provide an electrical connection of both sides of said intermediate layer. After filling the hole, the same surface can be used again for a smaller borehole in order to generate, for example, a contact connection between printed circuit board layers which are located more outside.

In this context, for example air bubble and/or foreign particle inclusions may occur when the holes are filled with the filling material, which reduces the quality of the filling and thus the quality of the board.

III. SUMMARY OF THE INVENTION

It is an object of at least one embodiment of the invention to provide a filling assembly, by means of which holes formed in a plate can be filled with a filling material in a reliable and yet efficient manner.

According to an aspect of at least one embodiment of the invention, a filling assembly for filling holes formed in a plate with a filling material includes a support device for supporting the plate, a filling device having a filling material source and a feeding device connected to the filling material source and having a feeding channel arranged in a filling head for feeding filling material from the filling material source to the plate supported by the support device, the feeding channel leading to an output opening held adjacent to the plate, for filling the filling material into the respective holes of the supported plate, wherein the feeding device with the filling head thereof and the support device are moveable relative to each other, a vibration device connected to a side wall of the feeding channel, by which the side wall of the feeding channel can be vibrated at a particular frequency such that the feeding channel is correspondingly diminished at least adjacent to its output opening periodically, and a suction device having a suction channel provided in the filling head and leading to a suction opening adjacent to the output opening for evacuation of the respective holes directly before the holes are filled, the feeding channel, at least directly adjacent to its output opening, as well as the suction channel are arranged to be inclined.

According to an aspect of at least one embodiment of the invention, a filling assembly for filling holes formed in a plate with a filling material includes a support device for supporting the plate and a suction-filling head having a feeding channel connected to a filling material source for feeding filling material from the filling material source to the plate supported by the support device, the feeding channel leading to an output opening held adjacent to the plate, for filling the filling material into the respective hole of the supported plate, and a suction channel connected to a suction device for locally evacuating the respective hole to be filled, the suction channel leading to a suction opening directly adjoining the output opening of the feeding channel, wherein the supported plate and the suction-filling head are moveable relative to each other, such that the holes can be evacuated locally directly before being filled.

According to an aspect of at least one embodiment of the invention, the invention includes a method of operation of a filling assembly for filling blind holes formed in a plate.

According to an aspect of at least one embodiment of the invention, a filling assembly comprises a support device for supporting the plate, a filling device and a vibration device.

The support device can, for example, be a stationary holding or clamping device in which the plate is received. In this case, the filling device is formed to be movable in a horizontal and/or vertical direction, so as to be displaceable over the plate and the holes formed therein. Alternatively, the support device can be provided to be movable, i.e. as a transporting device, for example in the form of an endless conveyor belt on which the plate is supported and held. This has the advantage that the filling assembly can be operated continuously. In this case, the filling assembly can also be provided to be stationary. However, also the support device and the filling assembly can be provided to be movable.

The filling assembly comprises a filling material source and a feeding channel connected to the same. The filling material source can, for example, be a container, for example in the form of a cartridge, which contains the filling material and communicates with a pneumatic or hydraulic piston connected to a pneumatic or hydraulic source for displacing the filling material from the container. The feeding channel is connected at one end to the filling material source and at the other end leads to an output opening which is held adjacent to the upper side or the lower side of the plate, to convey the filling material by displacing the pneumatic or hydraulic piston from the filling material source via the feeding channel into the respective hole to be filled in the supported plate. The output opening of the feeding channel can rest directly on the upper side or lower side of the plate or can be held at a small distance to the same. The output opening of the feeding channel can, for example, be adapted to the cross-section of a single hole. Alternatively, the output opening can be formed in such a manner that several holes can be filled with filling material simultaneously. In this case, the output opening can be provided for example as a longitudinal slot or as an elongated hole, the length of which is adapted for example to the width of the plate or to the length of the plate, or which measures for example ¼ to ⅓ of the width of the plate, so as to be able to go over the plate in the form of rows.

The vibration device communicates with a side wall of the feeding channel in such a manner that it can vibrate the side wall at a particular frequency transverse to the feeding channel, such that the feeding channel is correspondingly diminished at least adjacent to its output opening periodically. In other words, at least a portion of the feeding channel side wall adjoining the output opening is laterally pressed in by the vibration device periodically, i.e. is charged with an area load. The vibration device can, for example, comprise an electromagnet. In this respect, the vibration device can communicate with the side wall of the feeding channel for example via a magnetic field. Alternatively, the vibration device and the side wall can also be in physical contact to each other. For example, the vibration device can comprise a stamp which is periodically pressed against the corresponding side wall portion of the feeding channel.

Due to this periodical diminution of the feeding channel, the filling material is accelerated during the filling operation near the output opening periodically in an increased manner, i.e. it is displaced from the feeding channel in an increased manner. In addition, the filling material which has already been filled in is distributed in the hole to be filled and pressed in firmly by the vibrating side wall portion, which is comparable with smoothing and distributing filler by means of a spattle. Therefore, the holes to be filled can be filled by means of the filling assembly according to the invention in a reliable manner, i.e. by avoiding gas inclusions such as air inclusions. With the filling assembly according to the invention, even blind holes can be filled without air bubbles and at a sufficient quality. The filling assembly according to the invention is therefore suitable for filling blind holes as well as for filling through-holes.

The plate can for example be a printed circuit board, such as a multilayered printed circuit board. However, the plate can also be any other plate, such as a furniture plate, in which holes or boreholes to be filled are provided. The filling material can for example be a viscous paste which cures after having been filled into the hole. In the case of printed circuit boards, the filling material can for example be a conductive filler compound, such as a silver paste. However, filler pastes on the basis of epoxy resin are more cost-effective at the moment and are therefore provided as well.

The frequency at which the feeding channel side wall portion is vibrated or pressed in periodically, i.e. repeatedly, can for example be in a range of 30 Hz to 120 Hz, for example in a range of 50 Hz to 100 Hz. The frequency as well as the amplitude (impression depth) of the vibration can be constant or can vary during a single hole filling process or during the entire plate treatment process. For example, the frequency and amplitude of the vibration can be chosen or set depending on the filling material, for example depending on the amount of filler in the filling material and/or the filler particle size in the filling material. In addition, the frequency may be set depending on the diameter of the hole and/or on the depth of the hole. The vibration profile can for example be sinusoidal. For example a saw tooth profile or a rectangular profile has proven to be suitable as well.

According to an embodiment, the feeding channel is arranged to be inclined to the supporting plate at least directly adjacent to its output opening, such that the filling material is supplied to the plate obliquely. According to an exemplary embodiment, the vibrating wall portion is correspondingly inclined in this context and extends further to the output opening, for example, such that the wall portion introduces the filling material into the holes by means of its movement like a spattle. Thereby, the filling material can be inserted in the hole to be filled and distributed in the same, which ensures the quality of the filling in an even more reliable manner. Due to the fact that the vibrating side wall portion of the feeding channel which is arranged to be inclined to the plate surface presses in and displaces the filling material present in the hole periodically during the overcoating of the hole to be filled, the filling material is distributed in the hole in an optimal way. In addition, due to the oblique feeding, the filling material is distributed in the hole in an improved manner, and the formation of air bubble inclusions is avoided in an even more reliable manner. In this regard, as an example, an angle between the end portion of the feeding channel facing the plate and the upper side of the plate of less than or equal to 45° has proven to be suitable. In such an arrangement, even boreholes/holes having an irregular cross-section and undercuts can be filled at a sufficient quality. According to another embodiment, the feeding channel can also be provided/arranged to be substantially perpendicular to the upper side of the plate.

According to another embodiment, the filling assembly can in addition comprise a suction device having a suction channel which leads to a suction opening arranged adjacent to the output opening of the feeding channel. The suction device can for example comprise a vacuum pump to which the suction channel is connected with its end opposing the suction opening. With the suction channel, the respective hole to be filled can be evacuated locally directly before being filled with filling material. For this purpose, the shape of the suction opening is adapted to the shape of the output opening in such a manner that at least the hole or rather the holes to be filled next can be evacuated directly before being filled. If the output opening is provided as an elongated hole, for example, the length of the suction opening substantially corresponds to the length of the elongated hole, the width of the suction opening being adapted to the size of the holes. The suction channel and the feeding channel can for example be connected to each other, such that they can be moved/displaced together relative to the upper side of the plate. For example, the suction channel and the feeding channel can be provided in an integral suction-filling head which is movable relative to the upper side of the plate. In this regard, the output opening of the feeding channel is arranged in the direction of motion behind the suction opening of the suction device, such that in case of a relative movement between the plate and the feeding channel and suction channel the hole to be filled is first evacuated locally and then filled with filling material.

It is possible to further improve the quality of the filling by means of the filling assembly according to this embodiment of the invention, by avoiding gas inclusions as well as foreign particle inclusions, such as dust particle inclusions or humidity inclusions even in blind holes in a safe manner. In addition, it is possible with the described suction device enabling a local short-term/temporary evacuation of the holes to reduce manufacturing and operating costs significantly in comparison with a vacuum or suction hood surrounding and evacuating the entire working space including the plate during the entire plate treatment process. In addition, a too strong gas emission from the printed circuit board is avoided by the directed, defined, and temporary application of a vacuum. As a matter of course, a vacuum hood surrounding the plate can be additionally provided according to this embodiment as well, by means of which a light vacuum can be applied over the plate during the filling process in order to further reduce the probability of gas and/or foreign particle inclusions. However, according to an embodiment, the operation proceeds exclusively with the local evacuation described above.

According to another embodiment, the side wall portion of the feeding channel, which can be vibrated by means of the vibration device, is provided with a stripping ledge facing the supported plate or is formed by the same. The stripping ledge or squeegee can always be kept in contact with the supported plate in this regard, to strip off excessive filling material. In addition or as an alternative, one or several squeegees can be arranged in the direction of motion behind the feeding channel.

According to another embodiment, several filling devices can be provided. For example, a first filling device can be provided above the plate, and a second filling device can be provided underneath the plate, such that holes formed in the upper side and in the lower side of the plate can be filled simultaneously. In this regard, a central/common vibration device can be provided for all filling devices, or several vibration devices are provided, for example exactly one vibration device for every filling device.

According to another aspect of the invention, a filling assembly comprises a support device for supporting the plate and a suction-filling head.

As it has been described above, the support device can be a stationary holding device or a movable transporting device.

The suction-filling head comprises a feeding channel connected to a filling material source (for example a filling material cartridge), which leads to an output opening held adjacent to the plate, and a suction channel connected to a suction device (for example a vacuum pump) for locally evacuating the respective hole to be filled. The suction channel leads to a suction opening which directly adjoins the output opening of the feeding channel, such that the holes can be evacuated locally directly before being filled, if the supported plate and the suction-filling head are moved relative to each other. For this purpose, the shape of the suction opening is adapted to the output opening, wherein the suction opening can also be provided to be somewhat larger than the output opening.

With the filling assembly according to this aspect of the invention it is possible to fill even blind holes in a reliable manner and at a sufficient quality, i.e. gas and foreign particle inclusions can be avoided safely even if blind holes are filled. In addition, manufacturing costs and operation costs can be reduced by the local, temporary evacuation of the holes, and gas emission from the printed circuit board can be avoided. However, according to this aspect a vacuum hood surrounding the plate may be additionally provided as a support, by means of which a light vacuum can be applied over the plate during the filling process, in order to further reduce the probability of gas and/or foreign particle inclusions.

For example, the feeding channel can be arranged at least adjacent to its output opening to be inclined to the supported plate. Thereby, an oblique feeding of the filling material to the plate and the holes, respectively, is achieved, such that it can be distributed in the corresponding hole in an improved manner and such that the formation of air bubble inclusions is reduced. For example, the feeding channel can be arranged at least adjacent to its output opening at an angle to the supported plate of less than or equal to 45°.

According to another embodiment, several suction-filling heads can be provided, in order to fill holes formed in the upper side and the lower side of the plate simultaneously.

IV. BRIEF DESCRIPTION OF THE DRAWINGS

The invention will hereinafter be described on the basis of the embodiments and with reference to the drawings.

Figure 2A:
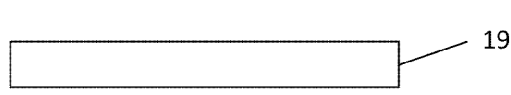
Figure 2B:
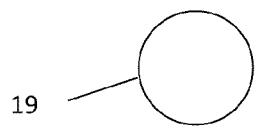
Figure 3:
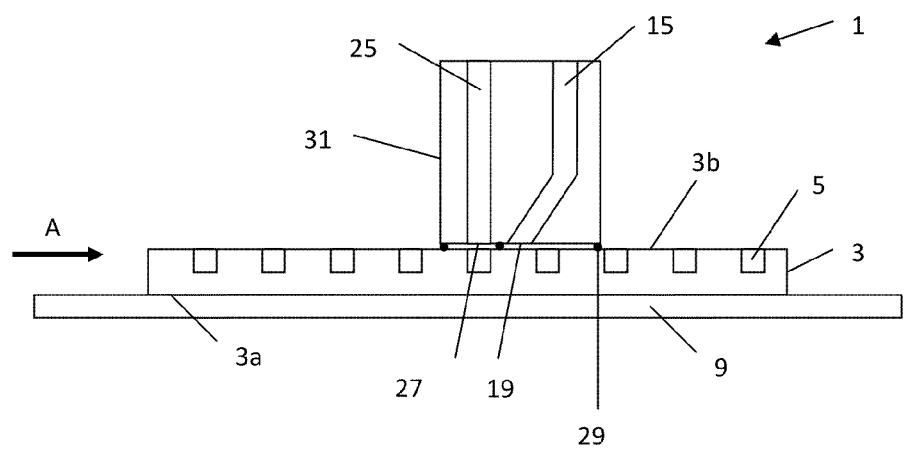

FIG. 1 is a schematic sectional view of a filling assembly according to an embodiment of the invention;

FIG. 2A and FIG. 2B each show a plan view of the output opening of a feeding channel of a filling assembly according to the invention; and FIG. 3 is a schematic sectional view of a filling assembly according to another embodiment of the invention.

In the drawings, like reference characters refer to the same parts.

V. DETAILED DESCRIPTION OF THE INVENTION

In FIG. 1, a filling assembly 1 according to a first embodiment of the invention is shown for filling blind holes 5 and through-holes 7 provided in a printed circuit board 3.

The filling assembly 1 comprises a support device 9 on which the plate 3 is supported with its lower plate side 3a. In this embodiment of the invention, the support device 9 is provided as a conveyor band and serves at the same time as a transportation device by means of which the plate 3 can be moved in the direction of the arrow A. In addition, the plate 3 is fixed to the conveyor band in such a manner, for example by means of a vacuum applied from below through a porous conveyor band, that it is secured against slipping or lifting.

In addition, the filling assembly 1 comprises a filling device 11. The filling device 11 comprises a filling material source 13 and a feeding channel 15 communicating with the filling material source 13. The filling device 11 is movable in a horizontal direction as well as in a vertical direction, the filling device 11 being not displaced in general during a plate treatment process.

According to this embodiment, the filling material source 13 is provided as a cartridge and communicates with a piston 17 which is connected to a pneumatic source that is not shown, such that filling material can be displaced from the cartridge into the feeding channel 15 by moving the piston.

The feeding channel 15 is connected at one end to the filling material source 13 and leads at its other end to an output opening 19 which according to this embodiment rests directly on the upper side of the plate 3b, such that excessive filling material is stripped off by the limiting wall of the feeding channel 15. In this context, the end portion of the feeding channel 15 facing the upper side of the plate 3b can be provided for example with a sealing element surrounding the output opening 19 of the feeding channel 15 and contacting the plate 3, such that the filling material cannot escape laterally from the feeding channel 15. As it is indicated in FIG. 2A and in FIG. 2B, the output opening 19 can be formed to fill several holes 5, 7 (FIG. 2A) simultaneously or to fill exactly one hole 5, 7 (FIG. 2B). In this context, the output opening 19 is adapted to the cross-section of the holes 5, 7 to be filled, wherein, however, the output opening 19 does not have to correspond to the cross-section of the at least one hole to be filled or rather does not have to cover the at least one hole entirely, but can also be larger or smaller than the at least one hole to be filled. According to an embodiment, the output opening 19 is larger than the holes to be filled. According to the embodiment shown in FIG. 2A, the output opening 19 is elongate and rectangular, the suction opening (not shown) being formed correspondingly and being located in front of or upstream to the output opening 19 and running in parallel thereto; however, elongate, oval openings are imaginable in this context as well. According to this embodiment, the feeding channel 15 is provided to be exchangeable, wherein several feeding channels 15 are provided with output openings 19 of different shapes, such that plates 3 with varying plate and/or hole sizes can be treated by the filling assembly 1.

In addition, the filling assembly 1 comprises a vibration device 21 which communicates with at least one side wall 23 of the feeding channel 15 and which is arranged to vibrate the side wall 23 at least in sections adjacent to the output opening 19 in a direction transverse to the feeding channel 15, i.e. to press the same in repeatedly, as it is shown by the dashed line in FIG. 1. For this purpose, the side wall 23 is provided to be flexible at least on a side wall portion 23a. In the embodiment according to FIG. 1, the flexible side wall portion 23a is made of a magnetizable material and the vibration device 21 comprises an electromagnet which communicates with the flexible side wall portion 23a via a magnetic field. According to an embodiment, the entire side wall 23 is vibratingly movable transverse to the feeding channel 15.

The filling assembly 1 further comprises a vacuum pump which is not shown, to which a suction channel 25 is connected. The suction channel 25 is laterally connected to the feeding channel 15 and can be displaced together with the same. The suction channel 25 is arranged in the plate movement direction A in front of the feeding channel 15 and leads to a suction opening 27 which adjoins the output opening 19 directly, such that the holes 5, 7 to be filled are evacuated locally directly before being filled with filling material. According to this embodiment, the suction opening 27 rests directly on the upper side of the plate 3b via a sealing element 29 surrounding the suction opening 27, wherein the suction opening 27 can be arranged alternatively at a distance to the upper side of the plate 3b as well.

According to this embodiment, the suction channel 25 as well as the feeding channel 15 are arranged to be inclined to the upper side of the plate 3b, wherein it is sufficient to provide only the feeding channel 15 to be inclined to the upper side of the plate 3b.

In the following paragraphs, the process of filling the holes 5, 7 formed in the upper side of the plate 3b by means of the filling assembly 1 according to this embodiment will be described.

First of all, the plate 3 is laid with its lower plate side 3a on a plate-shaped basis and is fixed together with the basis to the conveyor band. The basis serves as a limiting wall when the through-holes 7 are filled, such that the filling material cannot escape on the lower side of the plate 3a. Then, a suitable feeding channel 15, i.e. a feeding channel which is adapted to the plate shape, and a corresponding suction channel 25 are connected to the filling material source 13 and the vacuum pump, respectively. Then, the feeding channel 15 and the suction channel 25 are moved into an appropriate starting position, and the vacuum pump is switched on. Finally, the conveyor band is switched on, the pneumatic source is connected to the piston 17, and the vibration device 23 is activated. Then, the plate 3 is continuously moved longitudinally underneath the filling device 11, the holes 5, 7 arranged in a longitudinal direction of the plate first being successively evacuated and then immediately being filled with filling material. Due to the fact that the suction opening 27 as well as the output opening 19 are sealed against the environments by means of a sealing, and that the output opening 19 directly adjoins the suction opening 29, no air gets in the respective holes between the evacuation process and the filling process. Due to the local and thereby only temporary evacuation, gas emissions from the plate and filling material are avoided.

In order to fill the blind holes 5' formed in the lower side of the plate 3a, the plate 3 can simply be turned around after the curing of the filling material, and can be put into the filling assembly 1 again. Alternatively, a second filling device 11, a second suction channel 25, and a second vibration device 21 can respectively be arranged underneath the plate 3. In this case, the support device 9 can be provided, for example, in such a manner that it supports or holds the plate 3 laterally.

In FIG. 3, a filling assembly 1 is shown according to a second embodiment of the invention, comprising a support device 9, on which the plate 3 is supported with its lower plate side 3a, and a suction-filling head 31 facing the upper side of the plate 3b. The support device 9 and the suction-filling head 31 are moveable relative to each other.

The suction-filling head 31 comprises a feeding channel 15 connected to a filling material source which is not shown, which leads to an output opening 19 held adjoining the upper side of the plate 3b, and a suction channel 25 connected to a suction device which is not shown, which leads to a suction opening 27 held adjoining the upper side of the plate 3b, for local evacuation of the respective hole to be filled. The feeding channel 15 passes at its end portion facing the upper side of the plate 3b in an oblique manner through the suction-filling head 31, such that this portion is inclined to the upper side of the plate 3b. The suction channel passes straight through the suction-filling head 31 and is disposed substantially perpendicular to the upper side of the plate 3b. The suction opening 27 and the output opening 19 are adapted to the number and shape of the holes to be filled simultaneously, as it has been described with respect to the first embodiment, wherein also according to this embodiment several exchangeable suction-filling heads 31 can be provided. The suction opening 27 and the output opening 19 are also each surrounded by a sealing, the suction opening 27 and the output opening 19 being separated from each other by this respective sealing.

I claim:

1. Filling assembly for filling holes formed in a plate with a filling material, comprising:
    a support device for supporting the plate,
    a filling device having a filling material source and a feeding device connected to the filling material source and having a feeding channel arranged in a filling head for feeding filling material from the filling material source to the plate supported by the support device, the feeding channel leading to an output opening held adjacent to the plate, for filling the filling material into the respective holes of the supported plate, wherein the feeding device with the filling head thereof and the support device are moveable relative to each other,
    a vibration device connected to a side wall of the feeding channel, by which the side wall of the feeding channel can be vibrated at a particular frequency such that the feeding channel is narrowed periodically at least adjacent to its output opening, and
    a suction device having a suction channel provided in the filling head and leading to a suction opening adjacent to the output opening for evacuation of the respective holes directly before the holes are filled,
    the feeding channel, at least directly adjacent to its output opening, as well as the suction channel are arranged to be inclined.

2. Filling assembly according to claim 1, wherein the feeding channel is arranged at least directly adjacent to its output opening at an angle to the supported plate of less than or equal to 45°.

3. Filling assembly according to claim 1, wherein the side wall of the feeding channel which can be vibrated by the vibration device is provided with a stripping ledge facing the supported plate, which can always be kept in contact with the supported plate, to strip off excessive filling material.

4. Filling assembly according to claim 1, wherein the vibration device comprises an electromagnet.

5. Filling assembly according to claim 1, comprising a plurality of filling devices for simultaneously filling holes formed in the upper side and in the lower side of the plate.

6. Filling assembly according to claim 1, wherein the feeding channel includes an inclined section extending from its output opening at an angle of no more than 45° as measured from the supported plate, and the feeding channel further including a second wall opposed to the side wall, wherein the second wall and the side wall in the inclined section of the feeding channel have an angle of no more than 45° as measured from the supported plate.

7. Filling assembly according to claim 6, wherein the feeding channel includes a vertical section extending from the inclined section.

8. Filling assembly according to claim 1, wherein the feeding channel as a whole is inclined.

9. Filling assembly for filling holes formed in a plate with a filling material, comprising:

a support device for supporting the plate;
a filling head;
a filling device having
a filling material source, and
a feeding channel passing through said filling head and in communication with said filling material source adapted to feed filling material from said filing material source to the plate supported by said support device, said feeding channel including
at least two walls opposed to each other, said at least two walls are inclined relative to said support device, and
an output opening partially defined by said at least two walls, said output opening held adjacent to the plate for filling the filling material into the respective holes of the supported plate;
a suction device having a suction channel provided in said filling head and leading to a suction opening adjacent to the output opening for evacuation of the respective holes directly before the holes are filled; and
a vibration device connected to one of said at least two walls of said feeding channel, by which said wall of said feeding channel can be vibrated at a particular frequency such that said feeding channel proximate said output opening is narrowed periodically, and
wherein said filling head and said support device are moveable relative to each other.

10. Filing assembly according to claim 9, wherein said at least two walls of said feeding channel are inclined at an angle of no more than 45° relative to said support device.

11. Filing assembly according to claim 10, wherein said feeding channel includes a section where said at least two walls of said feeding channel are substantially vertical relative to said support device.

12. Filling assembly according to claim 9, wherein said wall of said feeding channel which can be vibrated by said vibration device is provided with a stripping ledge facing said support device to strip off excessive filling material.

13. Filling assembly according to claim 9, wherein the vibration device comprises an electromagnet.

14. Filling assembly according to claim 9 further comprising a plurality of filling devices for simultaneously filling holes formed in the upper side and in the lower side of the plate.

15. Filing assembly according to claim 9, wherein said filling device includes a sealing element around said opening of said feeding channel.

16. Filling assembly according to claim 9, wherein said suction channel is angled at the same angle as said feeding channel.

17. Filling assembly for filling holes formed in a plate with a filling material, comprising:

a support device for supporting the plate;
a filling head;
a filling device having
a filling material source, and
a feeding channel passing through said filling head and in communication with said filling material source adapted to feed filling material from said filing material source to the plate supported by said support device, said feeding channel is inclined relative to said support device such that opposing surfaces inside of said feeding channel are parallel, said feeding channel including
at least one wall, and
an output opening partially defined by said at least one wall, said output opening held adjacent to the plate for filling the filling material into the respective holes of the supported plate;
a suction device having a suction channel provided in said filling head and leading to a suction opening adjacent to the output opening for evacuation of the respective holes directly before the holes are filled; and
a vibration device in communication with one of said at least one wall of said feeding channel, by which said surface of said feeding channel can be vibrated at a particular frequency such that said output opening of said feeding channel is narrowed periodically, and
wherein said filling head and said support device are moveable relative to each other.

18. Filing assembly according to claim 17, wherein said feeding channel is inclined at an angle of no more than 45° relative to said support device.

19. Filing assembly according to claim 17, wherein said feeding channel includes a section where said feeding channel is substantially vertical relative to said support device.

20. Filling assembly according to claim 17, wherein said vibration device comprises an electromagnet and said surface in communication with said vibration device includes magnetizable material.

* * * * *